United States Patent [19]

Schoberl

[11] 3,864,727

[45] Feb. 4, 1975

[54] SEMICONDUCTOR DEVICE

[75] Inventor: Werner Schoberl, Heilbronn, Germany

[73] Assignee: Licentia, Patent-Verwaltungs-G.m.b.H., Frankfurt am Main, Germany

[22] Filed: Mar. 17, 1970

[21] Appl. No.: 20,203

[30] Foreign Application Priority Data

Mar. 21, 1969 Germany .................... 1914442

[52] U.S. Cl. .................... 357/65, 174/525, 357/68, 357/70, 357/72, 357/81

[51] Int. Cl. .................... H01l 3/00, H01l 5/00

[58] Field of Search .......... 317/234, 235, 3, 3.1, 4, 317/4.1, 5, 5.4; 174/52 PE

[56] References Cited

UNITED STATES PATENTS

| | | | |
|---|---|---|---|
| 3,283,224 | 11/1966 | Erkan | 317/234 |
| 3,387,190 | 6/1968 | Winkler | 317/234 |
| 3,396,361 | 8/1968 | Sussman | 317/234 |
| 3,404,214 | 10/1968 | Elliott | 174/52 PE |
| 3,404,215 | 10/1968 | Burks et al. | 317/234 |
| 3,469,148 | 9/1969 | Lund | 317/234 |
| 3,539,875 | 11/1970 | Fong et al. | 317/234 |
| 3,560,808 | 2/1971 | Segerson | 317/234 |

*Primary Examiner*—Andrew J. James
*Attorney, Agent, or Firm*—Spencer & Kaye

[57] ABSTRACT

A semiconductor device comprises a four terminal semiconductor component (such as a power transistor) mounted on a metallic base plate through an intermediate insulating plate, four metallic regions on the intermediate plate, two metallic regions being provided at the margin of the intermediate plate, opposite each other and between which a third metallic region extends to a position adjacent a fourth metallic region, means for connecting the electrodes of the semiconductor component with the metallic regions, strip electrode leads for two of the metallic regions and means for connecting the remaining two metallic regions to the base plate.

12 Claims, 7 Drawing Figures

Inventor:
Werner Schöberl
BY Spencer & Kaye
ATTORNEYS.

SEMICONDUCTOR DEVICE

BACKGROUND OF THE INVENTION

The invention relates to a semiconductor device comprising a four-terminal semiconductor component, particularly a power transistor.

The majority of housings hitherto known for semiconductor components have leads in the form of wire with a circular cross-section. These wire leads cause relatively high lead inductances so that components thus constructed are unsuitable for use at high frequencies. In order to reduce the lead inductances, it has already been proposed that the leads should be constructed in the form of strip. Thus there are already transistor components which comprise three or four leads in the form of strip of the same cross-section, which are disposed in one plane and radiate outwards and whereby a considerable reduction in the lead inductances is, in fact, obtained. It has been found, however, that even with these devices, the high-frequency characteristics obtained do not satisfy all requirements.

It has further been proposed already that a semiconductor housing should be so constructed that a wide-band compensation should be possible for the lead inductances and the lead capacitances at the output and at the input of a four-terminal semiconductor component. For this purpose, a metallic baseplate was connected to the electrode of the semiconductor component which was common to the input, and the output of the four-terminal network, while the other electrodes of the component were connected to leads in the form of strip which had a specific width and were at a specific distance from the metallic baseplate.

In order to realize such a housing construction, an intermediate plate of an insulating material was secured to a metallic baseplate. In the earlier device, this insulating intermediate plate has three metallised regions, which are separate from one another, on its surface remote from the baseplate. The metallising may consist of gold for example. In this case, the three metallised surface regions were disposed in a row one behind the other, the central region being electrically connected to the metallic baseplate through lateral faces of the intermediate disc which were likewise metallised. In the known device, the semiconductor body was secured to the outer metallised regions, while its electrodes were electrically connected, by means of thin lead wires, to the central metallised region and the third metallised surface situated at the other end of the insulating intermediate disc.

When making contact to a radio-frequency transistor, in the device described, the central metallised region on the insulating intermediate disc serves as an emitter connection, while the two outer metallic regions, which are connected to the leads in the form of strip, serve as collector and base connections respectively.

The construction of the electrodes and leads described for a housing for a radio-frequency transistor is based essentially on the problem of constructing the leads, which lead to the input electrodes and the output electrodes of a semiconductor component, with a characteristic impedance which corresponds to the input impedance assumed to be real. With such a construction of the leads inside and outside the housing, the leads no longer form inductive or capacitive components of the input or output resistance. Thus the semiconductor component may be used, for example, in a high-gain wideband radio-frequency amplifier.

The realisation of the resistance conditions aimed at is rendered more difficult, in particular, by the undesirably high lead inductances. These disturbing lead inductances are particularly noticeable, especially at high frequencies, for example above 300 Mcps, and in power transistors, the power of which is above 10 watts for example. It has been calculated for example that with a required frequency of 300 Mcps and a power dissipation of 10 watts, the lead inductances should not exceed a value of 1.6 nH. If the frequency limit is 500 Mcps, then the value for the maximum lead inductance may only be 0.95 nH.

In the housing described above for radio-frequency transistors with electrode leads in the form of strip, it has been found that the inductance conditions are worth improving further.

SUMMARY OF THE INVENTION

According to the invention, there is provided a semiconductor device comprising a four terminal semconductor component metallic base plate serving as an electrode lead, an insulating intermediate plate mounted on said metallic base plate and on which said four terminal semiconductor component is mounted, first and second metallic regions on said intermediate plate positioned opposite each other and at the margin of said intermediate plate, a third metallic region on said intermediate plate extending between said first and second metallic regions, a fourth metallic region on said intermediate plate at the margin of said intermediate plate and adjacent said third metallic region, means for electrically connecting each of the electrodes of the four terminals semiconductor component with one of said metallic regions, two strip electrode leads, which electrically connected to one of said metallic regions and means for connecting the remaining two of said metallic regions to said metallic base plate.

Further according to the invention, there is provided a semiconductor device comprising a four terminal power transistor, a metallic baseplate, an insulating intermediate plate mounted on said metallic baseplate first and second metallic regions on said intermediate plate positioned opposite each other at the margin of said intermediate plate and in electrical contact with said metallic baseplate, a third metallic region on said intermediate plate extending between said first and second metallic regions, and on which said four terminal power transistor is mounted and electrically connected therewith for providing a collector connecting area for said four terminal power transistor, a fourth metallic region in said intermediate plate at the margin of said intermediate plate and adjacent said third metallic region, means for connecting the emitter electrodes of said power transistor to said first and second metallic regions, and two strip electrode leads, each electrically connected to one of said third and fourth metallic regions.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
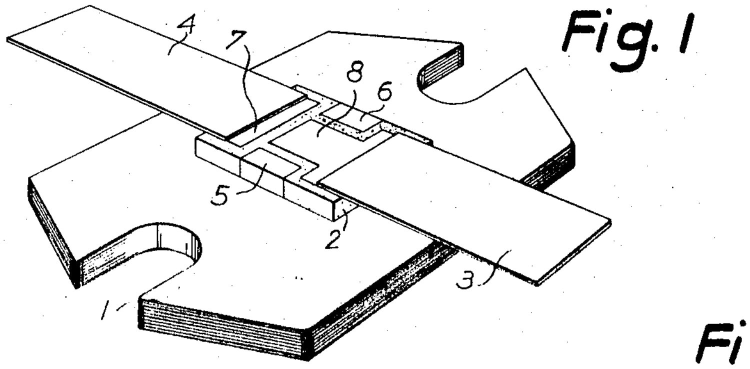
FIG. 1 is a perspective view of a metal base plate with an intermediate plate and strip electrodes for the production of a semiconductor device in accordance with the invention.

In order to reduce the lead inductance still further in a housing which consists of a metallic baseplate and further electrode leads in the form of strip which are insulated from the baseplate and which are connected by metallised regions, to an insulated intermediate plate provided on the baseplate, the present invention proposes that the intermediate plate should be provided with four metallised regions which are insulated from one another, that two of the metal platings should be disposed opposite one another at the edge of the insulating plate, that a third metal-plating should extend between the two metal-platings disposed at the edge, and that the third metal-plating should be separated by a short distance, from the fourth metal-plating which is likewise provided at the edge of the plate.

In the arrangement of the contact-metal plating on the insulating intermediate disc, in accordance with the invention, particular care has been taken to ensure that the emitter lead inductance is kept very low. This is necessary, in particular, because power transistors are generally operated with a common emitter connection. In this case, the higher the resistance of the lead inductance, the greater the feedback from the output to the input, which has a disturbing effect either as negative feedback or as positive feedback.

With the arrangement of the metallised regions on the insulating intermediate disc in accordance with the invention, the following important advantages can be obtained.

1. Between the base lead and the semiconductor body there is a very small gap, the base electrode of the transistor can be connected to the associated metallised region by a plurality of contact-making wires disposed parallel to one another.
2. The maintenance of a very narrow gap between the emitter metal-plating on the insulating intermediate plate in the semiconductor element. Here, too, a plurality of thin contact-making wires may be used to connect the emitter electrode to the emitter metal-plating, these contact-making wires then being electrically connected in parallel.
3. The emitter metal-plating may be connected to the metallic baseplate by means of a very short electrical path.
4. The arrangement constructed in accordance with the invention has very favourable electrical characteristics and can easily be produced by mass production.

In order to achieve the advantages outlined, the insulating intermediate plate is made rectangular or circular. With a rectangular intermediate plate, the surface barrier regions at all four sides are each provided, at least partially, with a metal-plating, one of the metal-platings extending between two opposite metal-platings, which cover only a portion of the length of the edge, to within the vicinity of the fourth boundary metal-plating. With such a geometrical arrangement, the two opposite boundary metal-platings are electrically connected to the metallic baseplate through the side face of the insulating disc. These boundary metal-platings then serve as a connection contact face for the emitter electrodes of the power transistor, while the metal-plating leading between these emitter contact surfaces is adapted to receive the semiconductor body or bodies and hence serve as a collector contact surface.

The collector contact surface is preferably T-shaped, the wider portion of the metal-plating being provided at the edge of the insulating plate. The narrower portion of the metal-plating then extends between the emitter contact surfaces disposed at the edge of the plate. With such an arrangement, the semiconductor body or bodies are secured, by their collector regions, to the narrower portion of a T-shaped collector contact surface, at as short a distance as possible from the emitter contact surfaces, the fourth base contact surface serving as a base connection. The emitter electrode and base electrode of the semiconductor body are electrically connected, by thin lead wires, to the associated contact areas on the insulating intermediate plate. The geometrical arrangement of the metal areas described so far on the insulating intermediate plate is particularly suitable for frequencies up to 300 Mcps and for a power up to about 10 watts.

For higher frequencies and for higher powers, the insulating intermediate plate is preferably likewise made rectangular. The margin of this intermediate disc is then provided, at one edge, with a metal-plating serving as a base contact area, while the margin of the plate opposite the base contact area receives two further metal-platings serving as emitter contact areas. The emitter contact areas are then preferably disposed in the surface regions of the plate. A fourth metal-plating, which serves as a collector contact area and which extends to within the immediate vicinity of the base metal contact area, is taken between these emitter contact areas. With this arrangement too, the collector contact area is preferably T-shaped, the broader portion of the contact area being disposed between the base and emitter contact areas and extending, for example, over the whole width of the insulating plate. The narrower portion of the collector contact area is then taken between the emitter contact areas which are disposed in the corners of the insulating intermediate plate. In such an arrangement, the emitter contact areas are also electrically connected to the metal baseplate through metal-plating at the side faces of the insulating plate.

In the last arrangement described, which is suitable for high frequencies and higher powers, one or more semiconductor bodies are secured, by their collector regions, to the broader portion of the T-shaped collector contact area. The base and emitter electrodes of the transistors are electrically connected to the associated contact areas on the insulating plate by means of thin lead wires. A plurality of thin lead wires, which are as short as possible and electrically connected in parallel, are preferably used for each electrode.

Referring now to the drawings, in FIG. 1, a metal plate 1 is illustrated, in a perspective view, with a smaller intermediate plate 2 of insulating material secured thereto, for example centrally. The insulating plate consists, for example, of beryllium oxide, while molybdenum or vacon may advantageously be used for the metal plate 1. Four metallised areas 5, 6, 7 and 8, which are insulated from one another, are provided on the surface of the insulating intermediate disc 2 opposite to the surface facing metal plate 1. The metal-plating consists, for example, of thin gold film which is pressed on. An electrode lead 4 or 3 in the form of strip is connected to each of the metal-platings 7 and 8 respectively, the lead strips extending away from the insulating plate in opposite directions. When making contact to an alloy transistor these lead strips preferably serve as base and collector connecting leads respectively.

Figures 2, 3:
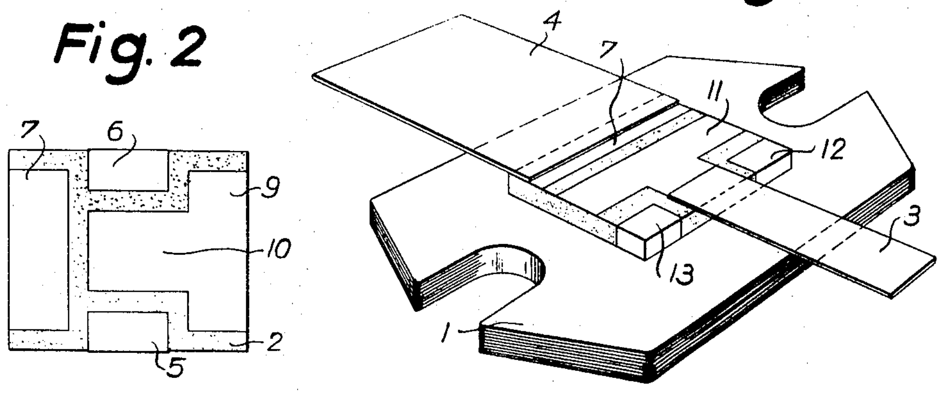
FIG. 2 is a plan view of the intermediate plate shown in FIG. 1.
FIG. 3 is a perspective view similar to FIG. 1 but using a differently configured intermediate plate.

The distribution of the metal-plating regions over the surface of the insulating intermediate plate can be seen more clearly in plan view in FIG. 2. At opposite edges of the intermediate plate 2, parts of the marginal regions are provided with metal-platings 5 and 6 which, as is particularly clear from FIG. 1, are electrically connected to the metal support 1, by parts of the side face of the intermediate plate which are likewise metallised. These two contact-making areas 5 and 6 preferably serve as a connection for the emitter electrodes of a power transistor to which contact is to be made. A further contact area 8, which is preferably T-shaped extends between the two contact areas 5 and 6, starting from another free marginal area. The wider portion 9 of this contact area is flush with the edge of the insulating intermediate plate and serves to secure the electrode lead 3 in the form of strip (FIG. 1). The narrower portion 10 of this contact area is between the emitter contact areas 5 and 6 and preferably serves for making contact to the collector regions of a transistor element. The marginal area is provided, at the edge which is still free, opposite the marginal area carrying contact area 8, with a fourth metal-plating 7 which preferably serves as a base contact area when making contact to a power transistor, and is electrically connected to the electrode lead 4 in the form of strip (FIG. 1).

A further example of the device according to the invention is illustrated in FIG. 3. A smaller rectangular intermediate plate of insulating material is again secured to a metallic baseplate 1. The corner marginal regions of the surface of the insulating intermediate disc opposite to the surface facing baseplate, are provided, at two adjacent corners, with the surface metal-platings 12 and 13, which are electrically connected to the metallic baseplate 1 through metallised portions of the side faces of the insulating plate. A further metal plating 11 is taken between these two metal-platings 12 and 13 and extends to within the vicinity of the further, opposite marginal metal-plating 7. The metal-platings 7 and 11 are connected, as is also the case in the arrangement shown in FIG. 1, to electrode leads 3 and 4 in the form of strip which are of different width.

Figures 4, 5, 6:
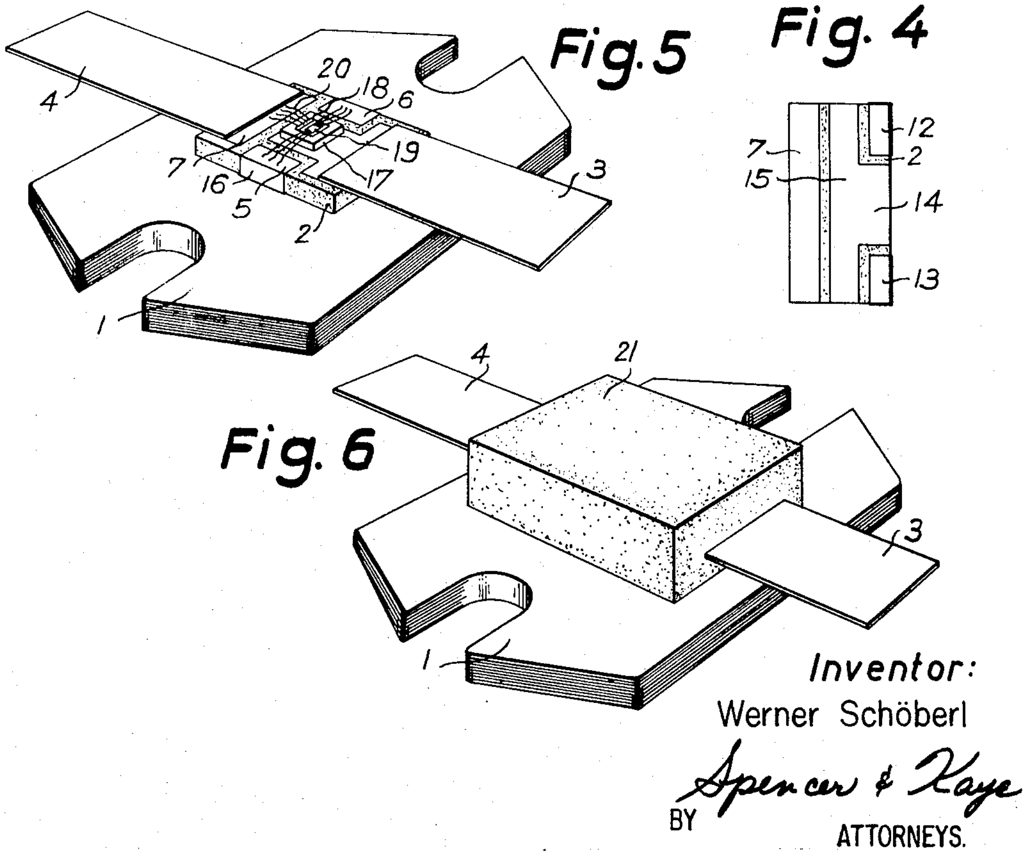
FIG. 4 is a plan view of the intermediate plate shown in FIG. 3.
FIG. 5 is a perspective view similar to FIG. 1 but with a power transistor in position on the intermediate plate.
FIG. 6 is a perspective view of the completed semiconductor device.

The geometrical arrangement of the surface metal-platings on the insulating intermediate disc are emphasised clearly on the insulating intermediate plate 2 in plan view in FIG. 4. The metal-plating 11 (FIG. 2), which covers the central portion of the insulating intermediate plate over its whole width, is disposed between the corner metal-platings 12 and 13 and the marginal metal-plating 7 which likewise extends over the width of the insulating plate. The metal-plating 7 preferably serves for the connection of the base electrodes of a power transistor, while the metal-platings 12 and 13 serve as emitter contact areas. The collector contact area 11 is preferably T-shaped, the semiconductor body or bodies being secured to the broader portion 15 of this contact area by their collector regions. The lead 3 in the form of strip (FIG. 3) is connected to the narrow portion 14 of the collector metal-plating. Since the distances between the semiconductor body on the collector contact area 15 and the metal-platings 7 or 12 and 13 associated with the electrodes are very short, the inductances caused by the connecting wires can be kept very low.

The making of contact to a power transistor is illustrated in FIG. 5. In this case, the starting point is a metal-plating arrangement on the surface of the insulating intermediate disc, as illustrated in FIGS. 1 and 2. The semiconductor body 17 is secured to the narrow portion 10 (FIG. 2) of the T-shaped contact area by its collector region, the collector region of the transistor being resistively connected to the metal-plating and hence also to the lead 3 in the form of strip. The emitter electrodes 19 of the transistors are electrically connected, by a plurality of thin lead wires, to the associated emitter contact areas 5 and 6. The emitter contact areas 5 and 6 are in turn connected to the metal baseplate 1 through the side metal-platings 16 on the insulating intermediate disc. The base electrode 18 of the transistor is likewise connected, by a series of contact-making wires 20 disposed parallel with one another, to the metallised region 7 associated with the base region on the insulating intermediate disc. The thin contact-making wires 20 are electrically connected in parallel with one another so that the total inductance of these lead wires is very low. As can be seen very clearly from the illustration in FIG. 5, all the connecting paths between the transistor body and the contact areas are extremely short. The emitter and the collector contact-making wires do not cross one another at any point so that the risk of short-circuits between the individual regions of the transistor element is eliminated.

The finished semiconductor component is illustrated in FIG. 6. In order to manufacture it, the insulating intermediate disc 2, together with the semiconductor body 17, and the connecting points for the lead strips are embedded or cast in glass, ceramic or a plastics material 21.

Figure 7:
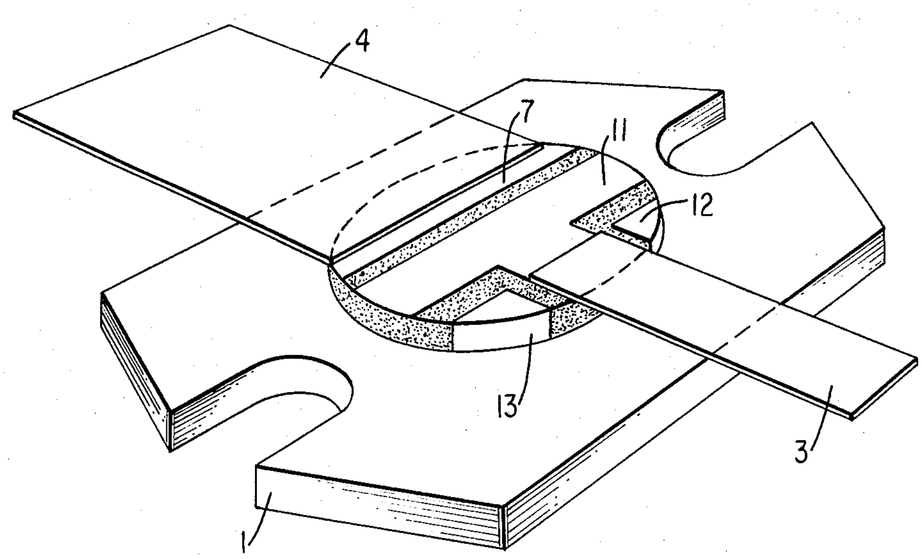
FIG. 7 is a view as in FIG. 3 of a structure modified from that of FIG. 3.

The structure of FIG. 7 is modified from that of FIG. 3 only in that the intermediate plate is circular.

It will be understood that the above description of the present invention is susceptible to various modifications, changes and adaptations.

What is claimed is:

1. A semiconductor device suitable for power applications, comprising a four terminal transistor, a metallic base plate, an insulating intermediate plate mounted on said metallic base plate, four metallic regions provided on a surface of said intermediate plate opposite to a surface facing said metallic base plate, first and second of said metallic regions positioned opposite each other and at the margin of said intermediate plate, a third of said metallic regions extending between said first and second regions, and a fourth of said metallic regions positioned opposite said third metallic region and at the margin of said intermediate plate, said transistor being secured to said third metallic region by a collector region, means for connecting emitter electrodes of said transistor to associated said first and second metallic regions, metallic regions on said intermediate plate connecting said first and second metallic regions with said base plate, means for connecting a base electrode of said transistor to said fourth metallic region, a strip electrode lead electrically connected to said third metallic region, and a strip electrode lead electrically connected to said fourth metallic region.

2. A device as defined in claim 1, wherein said intermediate plate is circular.

3. A device as defined in claim 1, wherein said intermediate plate is rectangular and has said four metallic regions extending to all four edges.

4. A device as defined in claim 1, wherein said means for connecting comprise sets of a plurality of parallel lead wires, each set for connecting an electrode of said transistor to one of said metallic regions.

5. A device as defined in claim 1, wherein said intermediate plate comprises beryllium oxide and said metallic regions comprise gold plating.

6. A device as defined in claim 1, wherein said metallic regions are metal platings on said intermediate plate.

7. A device as defined in claim 1, wherein said third metallic region comprises a first portion at the margin of said intermediate plate and parallel to this margin and a second portion at right angles to said first portion to form a "T" shape with said first portion and extending between said first and second metallic regions.

8. A device as defined in claim 7, wherein said transistor is secured by its collector portion to said second portion of said third metallic region as close as possible to said first.

9. A device as defined in claim 8, wherein said means for connecting comprise a plurality of thin lead wires for connecting said emitter electrodes to said first and second metallic regions and said base electrodes to said fourth metallic region.

10. A device as defined in claim 1, wherein said intermediate plate is rectangular, said fourth metallic region is positioned at a first margin of said intermediate plate, said first and second metallic regions are positioned at the corners of a second margin of said intermediate plate opposite said first margin, and said third metallic region extends from between said first and second metallic regions at said second margin to adjacent said fourth metallic region.

11. A device as defined in claim 10, wherein said third metallic region comprises a first portion extending between said first and second metallic regions at right angles to said second margin and a second portion extending at right angles to said first portion from a third margin of said intermediate plate to a fourth margin of said intermediate plate and between said first and second metallic regions and said fourth metallic region.

12. A device as defined in claim 11, said collector region being secured to said second portion of said third metallic region, said means for connecting comprising a plurality of thin lead wires for electrically connecting said emitter electrodes of said transistor with said first and second metallic regions and said base electrode of said transistor with said fourth metallic region.

* * * * *